US005908731A

United States Patent [19]

Leenders et al.

[11] Patent Number: 5,908,731
[45] Date of Patent: Jun. 1, 1999

[54] HEAT SENSITIVE IMAGING ELEMENT AND A METHOD FOR PRODUCING LITHOGRAPHIC PLATES THEREWITH

[75] Inventors: Luc Leenders, Herentals; Bart Aerts, Rumst, both of Belgium

[73] Assignee: Agfa-Gevaert, N.V., Mortsel, Belgium

[21] Appl. No.: 08/888,289

[22] Filed: Jul. 3, 1997

Related U.S. Application Data

[60] Provisional application No. 60/026,982, Sep. 20, 1996.

[30] Foreign Application Priority Data

Jul. 4, 1996 [EP] European Pat. Off. .............. 96201907

[51] Int. Cl.$^6$ .............. G03F 7/11

[52] U.S. Cl. .............. 430/273.1; 430/271.1; 430/275.1; 430/945; 430/964

[58] Field of Search .............. 430/273.1, 271.1

[56] References Cited

U.S. PATENT DOCUMENTS

| | | | |
|---|---|---|---|
| 5,353,705 | 10/1994 | Lewis et al. | 101/453 |
| 5,401,611 | 3/1995 | Edwards, Sr. et al. | 430/276 |
| 5,501,938 | 3/1996 | Ellis et al. | 430/201 |
| 5,536,619 | 7/1996 | Verburgh | 430/273.1 |
| 5,691,098 | 11/1997 | Busman et al. | 430/158 |

*Primary Examiner*—Kathleen Duda
*Assistant Examiner*—Jill N. Holloman
*Attorney, Agent, or Firm*—Breiner & Breiner

[57] ABSTRACT

According to the present invention there is provided a heat mode imaging element comprising in the order given:

i) a lithographic base having a hydrophilic surface, ii) a layer comprising a metal and/or a metallic derivative capable of being ablated by actinic radiation and iii) a hydrophobic layer characterized in that the hydrophobic layer is a cross-linked layer.

9 Claims, No Drawings

HEAT SENSITIVE IMAGING ELEMENT AND A METHOD FOR PRODUCING LITHOGRAPHIC PLATES THEREWITH

This application claims the benefit of provisional Application No. 60/026,982 filed Sep. 20, 1996.

FIELD OF THE INVENTION

The present invention relates to a heat mode imaging material for making a lithographic printing plate. The present invention further relates to a method for preparing a printing plate from said heat mode imaging material.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

Imaging elements which comprise a photosensitive composition are called photo mode imaging elements On the other hand, heat mode imaging elements, the surface of which can be made image-wise receptive or repellant to ink upon image-wise exposure to heat obtained by conversion of irradiation into heat and in most cases a subsequent development are also known for preparing lithographic printing plates. A particular disadvantage of photo mode imaging elements such as described above for making a printing plate is that they have to be shielded from the light. Furthermore they have a problem of sensitivity in view of the storage stability and they show a lower resolution. The trend towards heat mode printing plate precursors is clearly seen in the market.

Interesting heat mode imaging materials are those that have as heat mode layer a layer capable of being ablated by actinic radiation as described in e.g. U.S. Pat. Nos. 5,379,698, 5,353,705, EP-A-683,728, 678,380, 649,374, 580,393, 580,394 and DE 2,512,038. Particularly interesting heat sensitive imaging elements are those where said layer capable of being ablated by actinic radiation is a layer of a low melting, non-toxic metal with a low thermal conductivity metal such as aluminum, bismuth, tin, indium, tellurium etc.

A problem that arises with the present ablation based printing plate precursors is that said ablation process can cause formation of debris originating from the ablatable layer itself or of other functional layers of said precursor. Said debris can interfere with transmission of the laser beam (e.g. by depositing on a focusing lens or as an aerosol that partially blocks transmission) or with the transport of the imaging element during or after recording when this debris remains loosely adhered to the plate and deposition of said debris occurs on the transport rollers. So, there is a need for heat mode imaging elements based on ablatable layers which upon actinic radiation do not lead to said debris related problems.

SUMMARY OF THE INVENTION

It is an object of the present invention to provide a heat mode imaging element for making in a convenient way a lithographic printing plate having excellent printing properties.

It is another object of the present invention to provide a method for obtaining in a convenient way a positive working lithographic printing plate of a high quality using said imaging element.

Further objects of the present invention will become clear from the description hereinafter.

According to the present invention there is provided a heat mode imaging element comprising in the order given:

i) a lithographic base having a hydrophilic surface, ii) a layer comprising a metal and/or a metallic derivative capable of being ablated by actinic radiation and iii) a hydrophobic layer characterized in that the hydrophobic layer is a cross-linked layer.

According to the present invention there is also provided a method for obtaining a lithographic printing plate comprising the steps of:

i) image-wise or information-wise exposing to actinic radiation an imaging element as described above thereby causing heating of said heat mode imaging element at the exposed areas and ii) rubbing with or without a liquid said exposed imaging element to remove said layer comprising a metal and/or a metallic derivative and said hydrophobic layer in said exposed areas.

DETAILED DESCRIPTION OF THE INVENTION

It has been found that lithographic printing plates of high quality can be obtained according to the method of the present invention using an imaging element as described above. More precisely it has been found that the exposure of the heat mode imaging element does not cause debris during said step or the debris that is formed during said exposure does not become free in the atmosphere. The debris which may be formed upon exposure remains on the plate and nevertheles can be easily removed afterwards.

A cross-linked layer is a layer which is not soluble in a liquid without destroying the structure of at least one of the components comprised in said cross-linked layer.

Cross-linking of a layer can be effected by an addition or a condensation reaction. Said cross-linked layer is obtainable by curing a composition comprising monomers and/or polymers having at least two reactive groups and/or a multifunctional compound whereof the functions can react with said reactive group of said monomer and/or polymer;

The cross-linked hydrophobic layer can be obtained by e.g. thermal or radiation curing.

Thermal curing can be performed by using monomers and/or polymers having at least two chemical reactive groups and/or a multifunctional compound whereof the functions can react with said reactive group of said polymer. Examples of polymers having reactive groups are polyesters comprising hydroxy groups or carboxyl groups, polyamides comprising amino groups or carboxyl groups, polymers and copolymers of vinylphenol, polymers and copolymers of vinylalcohol etc.. Examples of monomers having reactive groups and/or of multifunctional compounds are di- or polyisocyanates, di- or poly epoxides, di- or polycarboxylic acids and derivatives thereof-, di- or poly alcohols or phenols, di- or poly amines etc.

Thermal curing can also be performed by using monomers which will cross-link with each other under the influence of heat e.g. polyols such as ditrimethylolpropane.

Preferably said thermal curing is effected with compounds which can react under the influence of a reagent obtained by decomposition of a heat sensitive compound. In one embodiment of the present invention said reactive compounds are curable by reaction with a free radical e.g. monomers or monomer mixtures, having at least one polymerizable ethylenically unsaturated groups, at least one monomer having at least two polymerizable ethylenically unsaturated groups. A monomer of said monomer mixtures can be a monomer having only one polymerizable ethylenically unsaturated group but preferably only monomers containing at least two polymerizable ethylenically unsaturated groups are used. Particularly preferred are urethane type monomers, such as those disclosed in EP-A 502562 and 653684 and unsaturated esters of polyols, especially esters of polyols and an alpha-methylene carboxylic acid.

Examples of esters of a polyol and an alpha-methylene carboxylic acid are: ethylene diacrylate, glycerol tri(meth) acrylate, ethylene dimethacrylate, 1,3-propanediol di(meth) acrylate, 1,2,4-butanetriol tri(meth)acrylate, 1,4-cyclohexanediol di(meth)acrylate, 1,4-benzenediol di(meth) acrylate, pentaerythritol tetra(meth)acrylate, dipentaerythritol pentaacrylate, 1,5-pentanediol di(meth) acrylate, the bis acrylates and methacrylates of polyethylene glycols of molecular weight 200–500, and the like.

Instead of or in combination with a monomer with at least one polymerizable ethylenically unsaturated group a prepolymer with at least one polymerizable ethylenically unsaturated group, preferably with two or more polymerizable ethylenically unsaturated groups can be used. Preferably, said prepolymer has a numerical average molecular weight of not more than 25,000, more preferably of not more than 10,000. The monomer or the prepolymer has at least two polymerizable ethylenically unsaturated groups.

In another embodiment of the present invention said reactive compound or mixture of reactive compounds is curable by reaction with an acid. The acid-sensitive compound can be a monomer capable of undergoing cationic polymerization which is well known to one skilled in the art. Alternatively said mixture of compounds comprises a compound with at least two hydroxy groups and a reagent which is capable of crosslinking under the influence of an acid. In another alternative said mixture of compounds comprises a compound comprising at least two latent or masked electrophilic groups that are transformed into electrophilic groups upon reaction with an acid and a compound containing an aromatic moiety that is susceptible to electrophilic aromatic substitution.

Monomers capable of undergoing cationic polymerization are preferably compounds comprising at least one vinylether, propenylether or epoxy function. At least a part of said monomers comprises at least two of said functions. More preferably all of said compounds comprise at least two of said functions. Most preferably polyfunctional epoxy compounds are used based e.g. on the reaction product of Bisphenol A, that is 2,2-bis (4-hydroxyphenyl) propane and epichlorohydrin, for example the resins sold under the registered trademark DER by Dow Chemicals.

Compounds comprising at least two hydroxy groups can be low molecular compounds but may also be polymers. Reagents which are capable of crosslinking under the influence of an acid said compounds with at least two hydroxy groups are e.g. compounds comprising at least two isocyanate groups, for example the compounds sold under the registered trade name DESMODUR by Bayer, tetraalkoxymethyl glycolurils, for example the compound sold under the registered trade name CYMEL 1170 by Dyno Cyanamid and compounds represented by the following formula

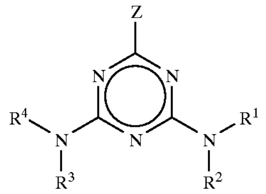

wherein Z represents —NRR' or a phenyl group, R, R' and $R^1$ to $R^4$ each independently represents a hydrogen atom, $CH_2OH$ or $CH_2OR^5$ in which $R^5$ represents an alkyl group. At least part of said compounds comprising at least two hydroxy groups or of said compounds which are capable of cross-linking under the influence of an acid said compounds with at least two hydroxy groups contains at least three functional groups.

Compounds comprising at least two latent or masked electrophilic groups may be aliphatic compounds comprising at least two hydroxy functions or compounds comprising an aromatic ring substituted with at least two latent or masked electrophilic groups or compounds comprising at least two aromatic rings comprising at least one latent or masked electrophilic group. The latent or masked electrophilic group is preferably $—CH_2OR^6$, wherein $R^6$ represents a hydrogen atom or an acyl rest. Also preferably said aromatic rings are substituted phenols.

Compounds containing an aromatic moiety that are susceptible to electrophilic aromatic substitution may be low molecular weight compounds but are preferably polymers, more preferably polymers containing a phenolic moiety, most preferably polyvinyl 4-hydroxy-styrene or novolac resins. At least part of said compounds comprising at least two latent or masked electrophilic groups contains at least three latent or masked electrophilic groups and/or the compounds containing an aromatic moiety that are susceptible to electrophilic aromatic substitution are susceptible to a threefold electrophilic aromatic substitution.

In still another embodiment of the present invention said reactive compound or mixture of reactive compounds can be cured by reaction with an alkali. Compounds which can undergo curing under the influence of alkali are e.g. polyfunctional epoxy compounds. More preferably polyfunctional epoxy compounds are used based on the reaction product of Bisphenol A, that is 2,2-bis (4-hydroxyphenyl) propane and epichlorohydrin, for example the resins sold under the registered trademark DER by Dow Chemicals.

As compounds which can decompose by heat to yield radicals mostly azo and peroxide compounds are used e.g. 2,2'-azobis-isobutyronitrile and benzoylperoxide. Said compounds are preferably used in an amount ranging from 0.001 to 1 $g/m^2$, more preferably in an amount ranging from 0.01 to 0.25 $g/m^2$.

Acid precursors which can decompose under the influence of heat for use in connection with the present invention include onium salts, in particular iodonium, sulfonium, phosphonium, selenonium, diazonium and arsonium salts.

Specific examples of particularly useful onium salts include:

diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate Other acid precursors which can decompose under the influence of heat for use in connection with the present invention include inorganic nitrates such as e.g. $Mg(NO_3)_2.6H_2O$ or organic nitrates such as guanidinium nitrate, ammonium nitrate, pyridinium nitrate etc . . . as disclosed in EP 462763, WO 81/1755, U.S. Pat. No. 4,370,401, compounds that release a sulfonic acid such as 3-sulfolenes, e.g. 2,5-dihydrothio-thiophene-1,1-dioxides as disclosed in U.S. Pat. No. 5,312,721, thermolytic compounds disclosed in GB 1.204.495, co-cristalline adducts of an amine and a volatile organic acid as disclosed in U.S. Pat. No. 3,669,747, aralkylcyanoforms as disclosed in U.S. Pat. No. 3,166,583, benzoinetosylaat, 2-nitrobenzyltosylaat and alkyl esters of organic sulfonic acids as described in EP 542008, thermoacids disclosed in EP 159725 and DE 3515176, squaric acid generating compounds as disclosed in U.S. Pat. No. 5,278,031, acid generating compounds disclosed in U.S. Pat. Nos. 5,225,314 and 5,227,277 and RD 11511 of November 1973.

Said heat sensitive acid precursors are preferably used in an amount ranging from 0.01 to 1 $g/m^2$.

Heat sensitive alkali precursors comprises t.-butyloxycarbonyl masked amines and dicyandiamides as described by G. Eastmond et al. in *Comprehensive Polymer Science,* Vol 6, Pergamon Press.

Said heat sensitive alkali precursors are preferably used in an amount ranging from 0.01 to 1 $g/m^2$.

Preferably the curing is performed by radiation curing. Radiation curing can be effected by using U.V. curable polymers and/or monomers containing epoxy groups. Radiation curing can also be effected with the compositions described above comprising compounds which can react under the influence of a reagent obtained by decomposition of a heat sensitive compound wherein the substance which yields said reagent is replaced by a substance which yields an identical or similar reagent by decomposition under the influence of radiation, preferably U.V. radiation. In many cases the substances yielding said reagent under the influence of heat is identical with the substance yielding said reagent under the influence of radiation.

As compounds which can decompose by radiation to yield radicals mostly the above mentioned azo and peroxide compounds are used.

In a preferred embodiment said cross-linked layer is formed by applying at least one ethylenically unsaturated monomer and a compound which can yield radicals by radiation on a layer comprising a metal and/or a metallic derivative capable of being ablated by actinic radiation and deposited under vacuum on a lithographic base having a hydrophilic support and performing the cross-linking by UV-radiation in the same passage through the same vacuum chamber.

Acid precursors which can decompose under the influence of radiation for use in connection with the present invention include the above mentioned onium salts.

Non-ionic acid precursors are also suitable for use in this invention. Examples of these include compounds of the formula:

$$RCH_2X,\ RCHX_2,\ RCX_3,\ R(CH_2X)_2 \text{ and } R(CH_2X)_3$$

wherein X is Cl, Br, F, or $CF_3SO_3$ and R is an aromatic group or an aliphatic group.

Further suitable non-ionic acid precursors are haloalkyl-substituted s-triazines as disclosed in EP-A 672954, o-quinone diazides, photo acid generating agents having an o-nitrobenzyl type protective group as described in *Polymer Sci.,* by S. Hayase et al, 25, 573 (1987); the compounds which are subjected to a photodecomposition to generate a sulfonic acid, represented by iminosulfonates as described in *Polymer Preprints* Japan, by M. Tunooka et al, 35 (8), by disulfon compounds described in JP-Pi 61-166544, by α-sulphonyloxy ketones, by α-hydroxymethylbenzoine sulphonates, by nitrobenzyl sulphonates, by α-sulphonyl acetophenones and by sulphonyl imides, the preparation of these last compounds being well known in the literature; the compounds which are subjected to a photodecomposition to generate a phosphonic acid, a partly esterified phosphoric acid or phosphoric acid, represented by nitrobenzylphosphates or phosphonates as described in *Tetrahedron Letters,* by M. Rubinstein et al., 17, 1445 (1975), by benzoine phosphates or phosphonates, as described in *J. Org. Chem.* by M. Pirrung and S. Shuey, 59 , 3890 (1994), by pyrenemethylphosphates or phosphonates, by iminophosphates or phosphonates and by imidophosphates or phosphonates, the preparation of these last compounds being well known in the literature.

Further, compounds in which the above photosensitive acid precursors are introduced into a primary chain or a side chain of a polymer can be used. Examples thereof include the compounds described in e.g. *J. Am. Chem. Soc.,* by M. E. Woodhouse et al, 104, 5586 (1982); *J. Imaging Sci.,* by S. P. Pappas et al, 30 (5), 218 (1986); etc..

More preferably the curing is performed by using electron beam curing on curable polymers obtainable from (meth) acrylate groups.

Most preferably said curing is performed by electron beam curing of (meth)acrylate monomers, particularly of polyfunctional (meth)acrylate monomers.

In a preferred embodiment of the present invention said cross-linked layer is formed by the following steps:

applying at least one polyfunctional monomer under vacuum in a vacuum chamber on said layer comprising a metal and/or a metallic derivative capable of being ablated by actinic radiation and deposited under vacuum on a lithographic base having a hydrophilic support and performing the cross-linking by electron beam curing in the same passage through the same vacuum chamber.

The thickness of the hydrophobic layer comprising a cross-linked polymer is preferably between 0.1 μm and 4 μm and more preferably between 0.1 μm and 1 μm.

The amount of the reactive compound or mixture of reactive compounds ranges preferentially from 0.1 to 5.8 $g/m^2$, more preferably from 0.5 to 3 $g/m^2$ The layer comprising a metal or a metal derivative in accordance with the present invention is preferably a vapour or vacuum deposited layer. Suitable metals are e.g.

aluminum, bismuth, tin, titanium, indium, tellurium etc.. Preferably bismuth is used. Also metal derivatives can be used such as metal oxides, metal suboxides, metal carbides, metal nitrides etc.. Preferably the thickness of the layer comprising a metal or a metal derivative is not more than 3 $\mu$m and most preferably not more than 1 $\mu$m. In case a vapour or vacuum deposited metal layer is used as a recording layer the thickness thereof is preferably such that the optical density is between 0.3 and 5 and more preferably between 1 and 4.

The coating of the hydrophilic surface of the lithographic base with the layer containing a metal and/or a metallic derivative and with an electron beam cured layer is preferably executed as an in-line production.

In a preferred embodiment of the present invention the coating of the hydrophilic surface of the lithographic base with the layer containing a metal and/or a metallic derivative and with an UV-radiation or electron beam curable layer and the curing of said last layer is preferably executed consecutively in the same vacuum passage.

According to one embodiment of the present invention, the lithographic base can be anodised aluminum. A particularly preferred lithographic base is an electrochemically grained and anodised aluminum support. According to the present invention, an anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30°to 50° C. Still further the aluminum oxide surface may be treated with polyvinyl phosphonic acid. A further interesting treatment involves rinsing the aluminum oxide surface with a bicarbonate solution. It is further evident that one or more of these post treatments may be carried out alone or in combination.

According to another embodiment in connection with the present invention, the lithographic base comprises a glass support or a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer on a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range from 0.2 to 25 $\mu$m and is preferably 1 to 10 $\mu$m.

Particular examples of suitable cross-linked hydrophilic layers for use in accordance with the present invention are disclosed in EP-A 601240, GB-P-1419512, FR-P-2300354, U.S. Pat. Nos. 3,971,660, 4,284,705 and EP-A 514490.

As glass support of a lithographic base in connection with the present embodimen glass can be used having a thickness of not more than 0.5 mm, a failure stress of at least $10^7$ Pa and a Youngs modulus of not more than $10^{11}$ Pa As flexible support of a lithographic base in connection with the present embodiment it is particularly preferred to use a plastic film e.g. substrated polyethylene terephthalate film, cellulose acetate film, polystyrene film, polycarbonate film etc . . . The plastic film support may be opaque or transparent. When the support is transparent, the exposure can take place through the support.

The heat mode imaging element used in accordance with the invention may contain additional layers such as e.g. one or more layers between the lithographic base and the layer comprising a metal and/or a metallic derivative for improving the adhesion of the layer comprising a metal and/or a metallic derivative to the lithographic base or intermediate layers between the hydrophobic layer and the layer comprising a metal and/or a metallic derivative. The shelf life of the imaging element may be influenced by the composition of the intermediate layers.

The heat mode imaging element in connection with the present invention is preferably exposed using a laser. Preferably used lasers are e.g. semiconductor lasers, YAG lasers e.g. Nd-YAG lasers, Argon lasers etc.. The laser may have a power output between 40 and 7500 mW and preferably operates in the infrared part of the spectrum. Rubbing of the image-wise exposed heat mode recording material can be done using a brush, a cotton pad etc.. Rubbing of the heat mode recording material in connection with the present invention can be carried out without the presence of a liquid. In this way images of good contrast and high density can be obtained. Rubbing may however also be carried out in the presence of a liquid for a better cleaning of the exposed areas without any detrimental effect on the image quality. More preferably, the liquid is a non-swelling agent for the cross-linked hydrophobic layer.

The present invention will now be illustrated by the following example without however limiting it thereto. All parts are by weight unless otherwise specified.

EXAMPLE 1

Preparation of the Lithographic Base

To 440 g of a dispersion containing 21.5% of $TiO_2$ (average particle size 0.3 to 0.4 $\mu$m) and 2.5% of polyvinyl alcohol in deionized water were subsequently added, while stirring, 250 g of a 5% of polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethylene-terephthalate film support (coated with a hydrophilic adhesion layer) to a wet coating thickness of 50 g/$m^2$, dried at 30° C., and subsequently hardened by subjecting it to a temperature of 57° C. for 1 week.

Deposition of the Metallic Film

A cylindrical vacuum chamber contained an electrically heated refractory tray in which bismuth was present as metal vapour source. Under high vacuum (i.e. at a pressure of about $10^{-2}$ Pa) the obtained metal vapour was directed towards the hydrophilic surface of the lithographic base and was deposited thereon at a thickness of 0.2 μm.

Coating and Curing of the Hydrophobic Layer

A mixture of 3 parts of Ebecryl 264 (trade name of UCB for an aliphatic urethanetriacrylate), 5 parts of Ebecryl 1290 (trade name of UCB for an aliphatic urethanehexaacrylate) and 2 parts of 1,6-hexanedialdiacrylate was coated on said metallic layer in a thickness of 1, 2 and 4 μm. Said coated materials were subjected to electron beam curing with a voltage of 150 kV and a dose of 4 Mrad.

Preparation of a Printing Plate and Making Copies of the Original

Imaging elements as described above were subjected to a scanning NdYAG infrared laser (scanspeed 100 m/s, spot size 15 μm, 3600 dpi and the power on the plate surface was varied from 2.0 to 6.0 W). Atfer imaging the plates were rubbed with a cotton pad and afterwards rinsed with water to remove at the exposed areas the hydrophobic layer and the metallic layer resulting in positive working lithographic printing plates.

The obtained lithographic printing plates could be used to print on a conventional offset press such as a Rotamatic R35 using a commonly employed ink such as AB Dick 10/20 and fountain. Excellent copies were obtained.

We claim:

1. A heat mode imaging element comprising in the order given:

i) a lithographic base having a hydrophilic surface, ii) a layer comprising a metal and/or a metallic derivative capable of being ablated by actinic radiation and iii) a hydrophobic layer characterized in that the hydrophobic layer is a cross-linked layer.

2. A heat mode imaging element according to claim 1 wherein said cross-linked layer is obtainable by curing a composition comprising monomers and/or polymers having at least two reactive groups and/or a multifunctional compound whereof the functions can react with said reactive group of said monomer and/or polymer.

3. A heat mode imaging element according to claim 1 wherein said cross-linked layer is obtainable by curing compounds which can react under the influence of a reagent obtained by decomposition of a heat sensitive compound.

4. A heat mode imaging element according to claim 1 wherein said cross-linked layer is obtainable by radiation curing of radiation curable polymers and/or monomers.

5. A heat mode imaging element according to claim 4 wherein said curing is electron beam curing.

6. A heat mode imaging element according to claim 5 wherein said cross-linked layer is obtainable by electron beam curing of a polymer obtainable from (meth)acrylate groups.

7. A heat mode imaging element according to claim 5 wherein said cross-linked layer is obtainable by electron beam curing of polyfunctional (meth)acrylate monomers.

8. A heat mode imaging element according to claim 5 wherein said cross-linked layer is obtainable by electron beam curing of a mixture comprising a polymer and polyfunctional polymerizable ethylenically unsaturated monomers.

9. A heat mode imaging element according to claim 1 wherein said layer comprising a metal or a metallic derivative comprises aluminum, bismuth, tin, titanium, indium or tellurium.

* * * * *